(12) United States Patent
Stephen et al.

(10) Patent No.: US 11,664,640 B1
(45) Date of Patent: May 30, 2023

(54) METHOD FOR INTEGRATION OF VARIABLE BRAGG GRATING COUPLING COEFFICIENTS

(71) Applicant: United States of America as represented by the Administrator of NASA, Washington, DC (US)

(72) Inventors: Mark A. Stephen, Catonsville, MD (US); Bowen Song, Santa Barbara, CA (US); Jonathan Klamkin, Santa Barbara, CA (US); Victoria Rosborough, Santa Barbara, CA (US); Joseph Fridlander, Santa Barbara, CA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 9 days.

(21) Appl. No.: 17/394,726

(22) Filed: Aug. 5, 2021

(51) Int. Cl.
| | | |
|---|---|---|
| *H01S 5/00* | (2006.01) | |
| *H01S 5/12* | (2021.01) | |
| *H01S 5/125* | (2006.01) | |
| *H01S 5/10* | (2021.01) | |

(52) U.S. Cl.
CPC .......... *H01S 5/1225* (2013.01); *H01S 5/1021* (2013.01); *H01S 5/125* (2013.01); *H01S 5/1209* (2013.01); *H01S 5/1228* (2013.01); *H01S 5/1237* (2013.01); *H01S 5/124* (2013.01)

(58) Field of Classification Search
CPC .... H01S 5/1225; H01S 5/1021; H01S 5/1209; H01S 5/1228; H01S 5/1237; H01S 5/125; H01S 5/124
See application file for complete search history.

(56) References Cited

U.S. PATENT DOCUMENTS

| | | | |
|---|---|---|---|
| 7,027,703 B2 * | 4/2006 | Joyner | H01S 5/227 216/2 |
| 2010/0246617 A1 * | 9/2010 | Jones | G02B 6/29325 385/10 |
| 2017/0207600 A1 * | 7/2017 | Klamkin | H01S 5/141 |
| 2021/0116645 A1 * | 4/2021 | Kojima | G02B 6/124 |

OTHER PUBLICATIONS

M.J. Strain et al., Post-Growth Fabrication and Characterization of Integrated Chirped Bragg Gratings on GaAs—AlGaAs, IEEE Photonics Technology Letters, vol. 18, No. 24, Dec. 15, 2006, pp. 2566-2568.

M.J. Strain et al., Integrated III—V Bragg Gratings for Arbitrary Control Over Chirp and Coupling Coefficient, IEEE Photonics Technology Letters, vol. 20, No. 22, Nov. 15, 2008, pp. 1863-1865.

(Continued)

*Primary Examiner* — Kinam Park
(74) *Attorney, Agent, or Firm* — Christopher O. Edwards; Trent J. Roche

(57) ABSTRACT

A non-etched gap is introduced along the length of an integrated Bragg grating with etched grooves such that the coupling coefficient, K, of the grating is reduced by the non-etched gap. In this way, multiple grating K values may be defined within a photonic integrated circuit using a single lithography and etch step. Additionally, the non-etched gap width may be varied along the length of a single grating to implement a chirped grating.

14 Claims, 2 Drawing Sheets

(56) References Cited

OTHER PUBLICATIONS

M.J. Strain et al., Design and Fabrication of Integrated Chirped Bragg Gratings for On-Chip Dispersion Control, IEEE Journal of Quantum Electronics, vol. 46, No. 5, May 2010, pp. 774-782.
Victoria Roseborough et al., Monolithic Integration of Widely-Tunable DBR and DFB Lasers with One-Step Grating Formation, Advanced Photonics Congress (IPR, Networks, NOMA, PVLED, SPPCom) © OSA 2019.
Victoria Rosborough et al., Monolithic Integration of DFB and Widely-Tunable DBR Lasers with One-Step Grating Formation, Advanced Photonics Congress—Jul. 29, 2019.

\* cited by examiner

METHOD FOR INTEGRATION OF VARIABLE BRAGG GRATING COUPLING COEFFICIENTS

ORIGIN OF THE INVENTION

The invention described herein was made by employees of the United States Government, and may be manufactured and used by or for the Government for Government purposes without the payment of any royalties thereon or therefore.

TECHNICAL FIELD

Example embodiments disclosed herein relate generally to a method for integration of variable Bragg grating coupling coefficients.

BACKGROUND

The complexity of indium phosphide (InP) based photonic integrated circuits (PICs) has increased in the past decade both in number of on-chip functions and functional complexity. Multiple active and passive elements such as lasers, modulators, couplers, and photodetectors are fabricated in a single PIC for applications such as coherent transmitters and receivers, optical downconverters for microwave frequency generation, and LIDAR. These PICs may employ multiple laser designs, including, but not limited to, sampled-grating distributed Bragg reflector (SGDBR) lasers for their wide tuning range and distributed feedback (DFB) lasers for their wavelength stability.

However, SGDBR and DFB lasers require different Bragg grating coupling coefficients for their operation. Typically, the coupling coefficient, K, of integrated gratings in group III-V semiconductor lasers is determined by the etch depth of the grating pattern. As a result, a separate electron beam lithography exposure and subsequent dry etch must be performed for each desired grating K. The high cost and low throughput of electron beam lithography prohibits implementation of an arbitrary number of grating K values. Additionally, because K is solely determined by the grating etch depth, it cannot be varied along the length of a grating.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a photonic integrated circuit, including: a first laser including a first grating forming a first mirror along a first waveguide, wherein the first grating has first grooves formed substantially perpendicular to a direction that light travels in the first waveguide, the first grooves have a depth, the first grooves have a first non-etched gap with a first width chosen to achieve a specified first K of the first mirror, where K is the coupling coefficient of the grating; and a second laser including a second grating forming a second mirror along a second waveguide, wherein the second grating has second grooves formed substantially perpendicular to a direction that light travels in the second waveguide, the second grooves have a depth that is the same is the depth of the first grooves, the second grooves have a second non-etched gap with a second width chosen to achieve a specified second K of the second mirror, wherein the first laser and the second laser are different types of lasers.

Various embodiments are described, wherein the first laser is a sampled-grating distributed Bragg reflector (SGDBR) laser and the second laser is a distributed feedback (DFB) laser.

Various embodiments are described, wherein the first laser is a distributed feedback (DFB) laser, further comprising a gain region and wherein the first grating is a distributed grating having uniform spacing.

Various embodiments are described, wherein the first laser is a sampled-grating distributed Bragg reflector (SGDBR) laser, further including a third grating forming a third mirror along the first waveguide, wherein the third grating has third grooves formed substantially perpendicular to a direction that light travels in the first waveguide, the third grooves have a depth that is the same is the depth of the first grooves and the second grooves, the third grooves have a third non-etched gap with a third width chosen to achieve a specified third K of the third mirror.

Various embodiments are described, wherein the first laser further comparisons a gain section and a phase section between the first mirror and the second mirror.

Various embodiments are described, wherein the first width of the first non-etched gap varies across the grooves.

Various embodiments are described, wherein the first width of the first non-etched gap varies across the grooves to implement a chirp.

Further various embodiments relate to a method of manufacturing a photonic integrated circuit, including: forming a first laser including a first grating that is a first mirror along a first waveguide, wherein the first grating has first grooves formed substantially perpendicular to a direction that light travels in the first waveguide, the first grooves have a depth, the first grooves have a first gap with a first non-etched width chosen to achieve a specified first K of the first mirror, where K is the coupling coefficient of the grating; and forming a second laser including a second grating that is a second mirror along a second waveguide, wherein the second grating has second grooves formed substantially perpendicular to a direction that light travels in the second waveguide, the second grooves have a depth that is the same is the depth of the first grooves, the second grooves have a second non-etched gap with a second width chosen to achieve a specified second K of the second mirror, wherein the first laser and the second laser are different types of lasers, and wherein the first grating and the second grating are formed during the same lithographic and etching step.

Various embodiments are described, wherein the first laser is a sampled-grating distributed Bragg reflector (SGDBR) laser and the second laser is a distributed feedback (DFB) laser.

Various embodiments are described, wherein the first laser is a distributed feedback (DFB) laser, further comprising a gain region and wherein the first grating is a distributed grating having uniform spacing.

Various embodiments are described, wherein the first laser is a sampled-grating distributed Bragg reflector (SGDBR) laser, wherein forming the first laser further includes forming a third grating that is a third mirror along the first waveguide, wherein the third grating has third grooves formed substantially perpendicular to a direction that light travels in the first waveguide, the third grooves have a depth that is the same is the depth of the first grooves and the second grooves, the third grooves have a third non-etched gap with a third width chosen to achieve a specified third K of the third mirror.

Various embodiments are described, wherein the first laser further comparisons a gain section and a phase section between the first mirror and the second mirror.

Various embodiments are described, wherein the first width of the first non-etched gap varies across the grooves.

Various embodiments are described, wherein the first width of the first non-etched gap varies across the grooves to implement a chirp.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

To facilitate understanding, identical reference numerals have been used to designate elements having substantially the same or similar structure and/or substantially the same or similar function.

DETAILED DESCRIPTION

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments are disclosed that present a method for integrating both sampled-grating distributed Bragg reflector (SGDBR) and distributed feedback (DFB) lasers on same substrate using a simplified fabrication process with a single grating lithography and etch step. This enables a wider range of photonic integrated circuit (PIC) designs and applications. Other types of lasers or devices that use gratings may also be implemented using the disclosed embodiments.

For example, to implement a precision photonic remote gas sensing circuit requiring a stable frequency-locked reference laser and a widely tunable probe laser, it is ideal to fabricate a DFB laser and SGDBR laser in the same circuit. The DFB laser has a fixed wavelength and a narrow line width. The SGDBR laser has a widely-tunable wavelength, but a larger line width than the DFB laser. Other photonic circuits may have a requirement for one or more of each of these laser types.

Figure 1:
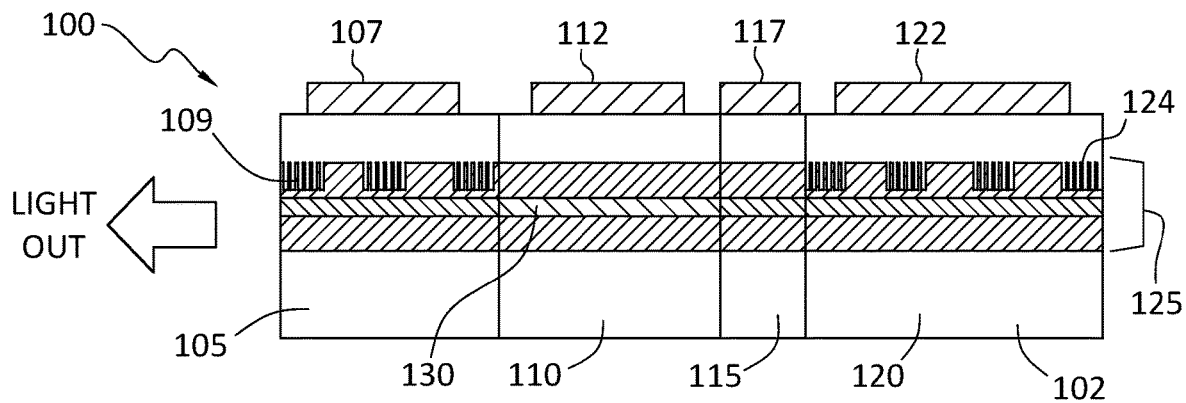
FIG. 1 illustrates a side cross-section of an SGDBR laser.

FIG. 1 illustrates a side cross-section of an SGDBR laser. The SGDBR laser 100 includes four sections: front mirror 105; rear mirror 120; gain section 110; and phase section 115. The waveguide 125 extends through each of the sections. The SGDBR laser 100 is built upon a substrate 102. Sampled gratings 109 and 124 are used to form the front and rear mirror sections. A sampled grating is similar to the continuous gratings found in distributed-feedback lasers except here the grating is sampled, or non-continuous. By sampling the grating, multiple reflectivity peaks are formed. These peaks are spaced apart in wavelength at a period inversely proportional to the period of the sampling. The front and back mirrors of the laser are sampled at different periods such that only one of their multiple reflection peaks can coincide at a time. This is known as the Vernier effect. In this way, the desired wavelength channel may be selected by tuning the two mirrors such that their reflection peaks overlap at the desired wavelength. Tuning is achieved via current injection into the mirror sections. A gain medium 130 in the gain section 110 may be a single quantum well, multiple quantum wells with barriers, or other gain medium. Electrodes 107, 112, 117, and 122 are found in each section so that a control signal may be applied to each section to change the operating parameters of the SGDBR laser.

Figure 2:
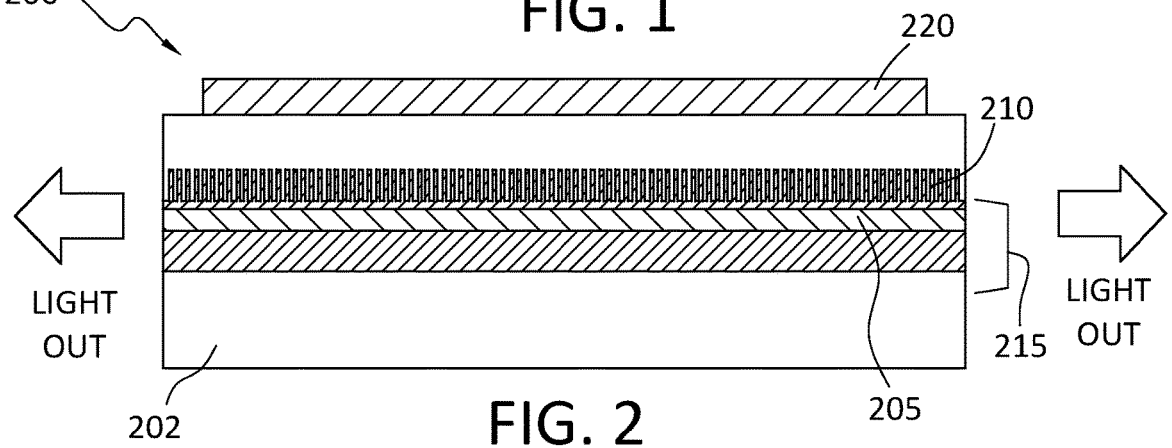
FIG. 2 illustrates a side cross-section view of a DFB laser.

FIG. 2 illustrates a side cross-section view of a DFB laser. The DFB laser 200 includes a substrate 202. A waveguide 215 is formed on the substrate. An active layer 205 is formed in the waveguide 215. The gain medium may be a single quantum well, multiple quantum wells with barriers, or other gain medium. Along the waveguide 215 a distributed grating 210 is formed. The distributed grating 210 forms a distributed mirror. The period and etch depth of this distributed grating 210 affect the parameters of the distributed mirror including the wavelength, K, and line width of the DFB laser 200. The DFB laser 200 also includes an electrode 220 used to power the DFB laser 200.

The DFB laser mirror K must be about an order of magnitude less than that of the SGDBR laser mirror K. Traditionally, fabrication of the periodic gratings comprising the mirrors in group III-V semiconductor waveguide lasers requires a separate round of lithography and etching for each desired mirror K because K is determined by the grating etch depth. Because electron-beam lithography, a time-consuming and expensive method, is usually used for defining the submicron-scale gratings, an embodiment of a design allowing for the definition of both types of gratings in a single lithography step is described herein.

The K of the mirror formed by the etched grating is a function of the etch depth of the grating. The deeper the etched portion, the greater the K becomes. As mentioned above, the K of the DFB laser mirror may need to be much less than the K of the SGDBR laser mirrors, so different etch depths are required for the two different lasers. This may also be true of other types of lasers or devices using gratings that might be integrated together on a single PIC.

Figure 3:
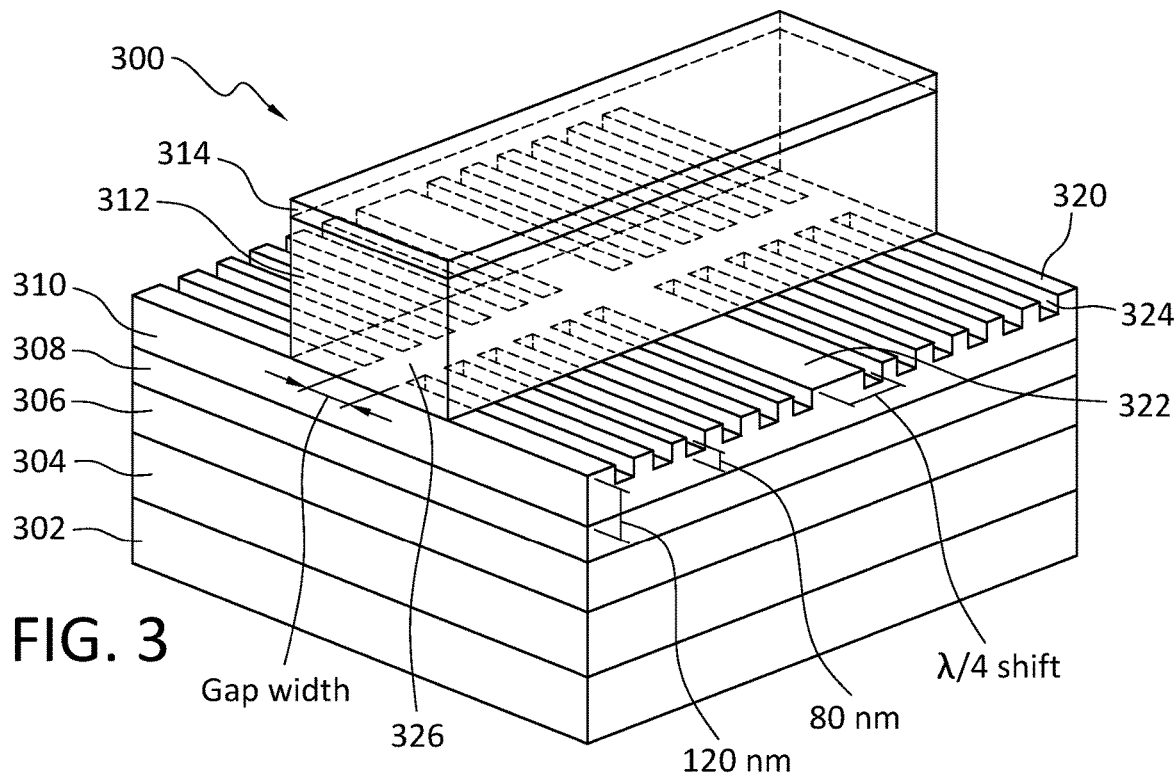
FIG. 3 illustrates a perspective view of a DFB laser grating with a central non-etched gap in the mirror grating.

Gratings with different K values are achieved in a single lithography and etch step by introducing a central non-etched gap along the length of the laser mirror grating. FIG. 3 illustrates a perspective view of a DFB laser grating with a central non-etched gap in the mirror grating. The DFB laser 300 includes the following layers: InP substrate 302; n-InP layer 304; 1.24 Q InGaAsP layer 306; quantum wells and barriers 308; 1.24 Q InGaAsP layer 310; p-InP layer 312; and p-InGaAs layer 314. This set of layers is only an example of how the DFB laser 300 may be constructed. It is noted that fewer or more layers with different materials may be used instead. The mirror grating 320 is formed in the layer 310. The grating 320 includes etched grooves 324 that extend across the DFB laser 300 in a direction substantially perpendicular to the direction that the light travels along the waveguide of the DFB laser 300. In this example, the layer 310 is shown as having a thickness of 120 nm. The depth of the etched grooves 324 are shown as 80 nm. The depth of the etched grooves 324 affects the K of the distributed mirror formed by the mirror grating 320. Also shown is a non-etched gap 326 in the etched grooves 324. This non-etched gap extends in a direction substantially perpendicular to the etched grooves 324 and in the direction that the light travels. The presence of the non-etched gap 326 reduces the overall grating K that would otherwise be determined solely by the depth of the etched grooves 324. The mirror grating 320 may also include a section 322 in the grating that represents a λ/4 shift for single longitudinal mode operation of the DFB laser.

Figure 4:
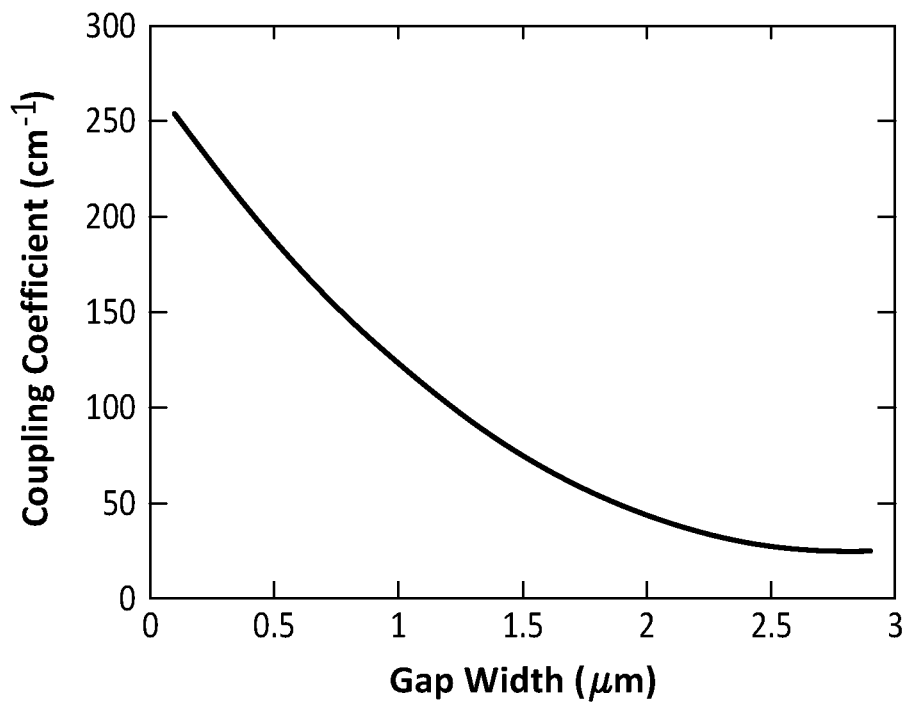
FIG. 4 illustrates an example calculation of the dependence of K on the non-etched gap width.

By controlling the width of the non-etched gap 326 in addition to the grating etch depth, the grating K may be tuned to the desired value. A single grating etch depth may be used across the entire sample (meaning only one round of lithography and etching is needed), while achieving various grating K values by specifying the non-etched gap width for each reflector. FIG. 4 shows the calculated reduction in K for increasing non-etched gap widths for the device illustrated in FIG. 3. Varying the non-etched gap width does not require any extra steps, as this dimension is completely controlled by the lithographic pattern. Although this concept was demonstrated with DFB and SGDBR InP/InGaAsP ridge waveguide lasers using a quantum well intermixing integration platform and a single p-side regrowth, it could be implemented in other platforms. Other materials include, but are not limited to, other group III-V semiconductors, group II-VI semiconductors, silicon-on-insulator (SOI) and planar lightwave circuit (PLC) materials such as silica and silicon nitride. Other integration methods include, but are not limited to, selective area growth, butt-joint growth, asymmetric twin waveguides, offset quantum well, dual quantum well and hybrid integration. Other integrated optical waveguide designs include, but are not limited to, rib, buried, deeply etched, diffused and dilute waveguides. Other types of integrated lasers include, but are not limited to, distributed Bragg reflector (DBR), external cavity, and extended cavity lasers.

It is noted that it is difficult to repeatably and reliably produce gratings with shallow etch depths. Hence, the non-etched gap width may be used to overcome this, by using a larger etch depth and then reducing the K associated with that etch depth to a lower value by selecting a non-etched gap width to achieve a desired K.

A benefit of this method is that it allows the designer to tune the grating K by independently controlling the etch depth and the non-etched gap width. Unlike sidewall gratings commonly implemented in silicon nitride (SiN) waveguides, the gratings are not etched all the way through the waveguide layer. This also differs from the traditional group III-V semiconductor laser integration approach of using only the grating etch depth to determine K.

The non-etched gap 326 is shown as in the center of the mirror grating 320, but it may be placed in other locations as well.

In FIG. 3 the width of the non-etched gap 326 is shown as being constant. In another embodiment, the width of the non-etched gap 326 may be varied along the length of the grating to create a chirped grating. Correctly designing the variation in the non-etched gap 326 width could, for example, improve the linewidth and side mode suppression ratio of a DFB laser by compensating for spatial hole burning.

Figure 5:
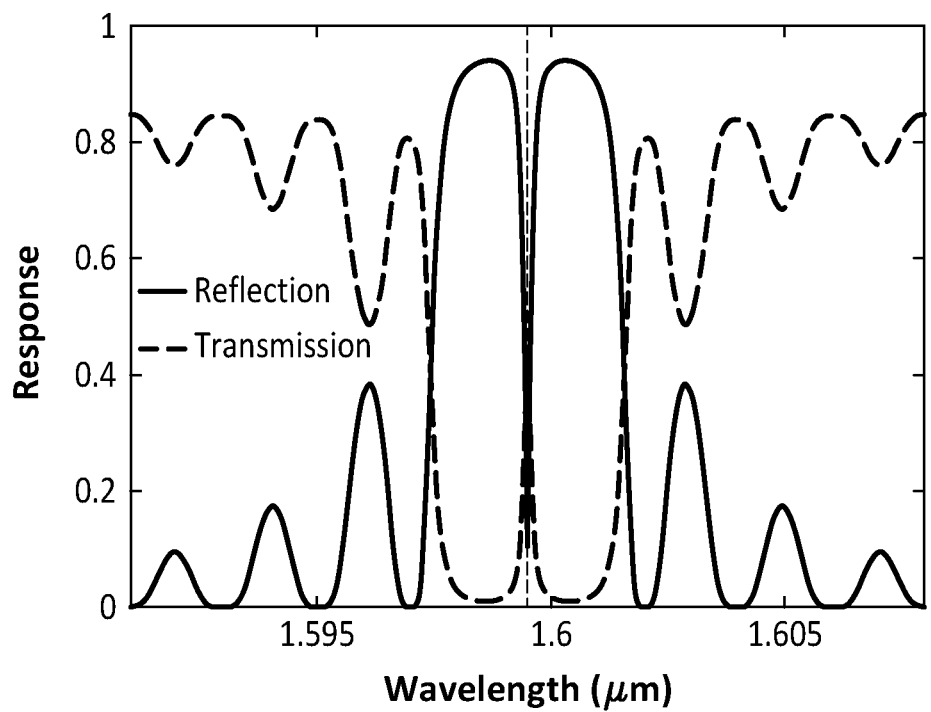
FIG. 5 shows an example calculated spectral response for a quarter-wave shifted DFB laser mirror with a central, 1 μm wide, non-etched gap in the grating.

A demonstration DFB laser and SGDBR laser were manufactured in a single InP PIC. Integration of active and passive components was achieved with a quantum well intermixing (QWI) process. Ion implantation into a sacrificial cap layer created vacancies that diffused into the quantum wells when annealed, resulting in a blueshift of the quantum well band edge in the passive waveguides and SGDBR laser mirrors and phase section. To achieve a lower grating K for the DFB laser mirror, a central non-etched gap was introduced into the vertically etched gratings as illustrated in FIG. 3. FIG. 5 shows the simulated grating response for a quarter-wave shifted grating with a central 1 μm-wide non-etched gap and the epitaxial structure shown in FIG. 3. This lower K design reduces fabrication time (because only one etch step was performed for the DFB and SGDBR lasers) and improves process reliability by eliminating the need for a shallower etch depth in the DFB laser gratings, which is more difficult to precisely target.

Various characteristics of the DFB laser and the SGDBR laser were measured. The output spectra of the SGDBR laser show that the SGDBR laser is tunable and achieves the desired performance using the same etch depth as the DFB laser. The output spectrum of the DFB laser showed single mode operation and an SMSR of 51.6 dB. Accordingly, this fabricated PIC illustrated that two different laser types could be manufactured using the same grating etch depth, and a non-etched gap in the grating could then be used to achieve the specific desired K and hence laser performance.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A photonic integrated circuit, comprising:
 a first laser including a first grating forming a first mirror along a first waveguide, wherein
  the first grating has first grooves formed substantially perpendicular to a direction that light travels in the first waveguide,
  the first grooves have a depth,
  the first grooves have a first non-etched gap with a first varying width chosen to achieve a specified first K of the first mirror, where K is the coupling coefficient of the grating wherein the value of the first k changes as the width of the first non-etched gap varies thereby achieving different first k values and being formed in a single lithography and etch step by introducing the first non-etched gap in a central region along the length of the first grating; and a second laser including a second grating forming a second mirror and a third grating forming a third mirror along a second waveguide, wherein the second grating has second grooves formed substantially perpendicular to a direction that light travels in the second waveguide, the second grooves have a depth that is the same is the depth of the first grooves, the second grooves have a second non-etched gap with a second width chosen to achieve a specified second K of the second mirror, with multiple reflectivity peaks formed, spaced apart in wavelength at a period inversely proportional to a period of a sampling of the second and third gratings whereby the second and third mirrors are sampled at different periods such that only one multiple reflection peak can coincide at a time;

wherein the first laser and the second laser are different types of lasers.

2. The photonic integrated circuit of claim 1, wherein the second laser is a sampled-grating distributed Bragg reflector (SGDBR) laser and the first laser is a distributed feedback (DFB) laser.

3. The photonic integrated circuit of claim 1, wherein the first laser is a distributed feedback (DFB) laser, further comprising a gain region and wherein the first grating is a distributed grating having uniform spacing.

4. The photonic integrated circuit of claim 1, wherein the second laser is a sampled-grating distributed Bragg reflector (SGDBR) laser, wherein the third grating has third grooves formed substantially perpendicular to a direction that light travels in the second waveguide, the third grooves have a depth that is the same is the depth of the first grooves and the second grooves, the third grooves have a third non-etched gap with a third width chosen to achieve a specified third K of the third mirror.

5. The photonic integrated circuit of claim 4, wherein the second laser further comparisons a gain section and a phase section between the second mirror and the third mirror.

6. The photonic integrated circuit of claim 1, wherein the first varying width of the first non-etched gap varies across the grooves.

7. The photonic integrated circuit of claim 1, wherein the first varying width of the first non-etched gap varies across the grooves to implement a chirp.

8. A method of manufacturing a photonic integrated circuit, comprising:

forming a first laser including a first grating that is a first mirror along a first waveguide, wherein the first grating has first grooves formed substantially perpendicular to a direction that light travels in the first waveguide, the first grooves have a depth, the first grooves have a first non-etched gap with a first varying width chosen to achieve a specified first K of the first mirror, where K is the coupling coefficient of the grating wherein the value of the first k changes as the width of the first non-etched gap varies thereby achieving different first k changes and being formed in a single lithography and etch step by introducing the first non-etched gap in a central region along the length of the first grating; and forming a second laser including a second grating that is a second mirror and a third grating forming a third mirror along a second waveguide, wherein the second grating has second grooves formed substantially perpendicular to a direction that light travels in the second waveguide, the second grooves have a depth that is the same is the depth of the first grooves, the second grooves have a second non-etched gap with a second width chosen to achieve a specified second K of the second mirror with multiple reflectivity peaks formed, spaced apart in wavelength at a period inversely proportional to a period of a sampling of the second and third gratings whereby the second and third mirrors are sampled at different periods such that only one multiple reflection peak can coincide at a time;

wherein the first laser and the second laser are different types of lasers, and wherein the first grating and the second grating are formed during the same lithographic and etching step.

9. The photonic integrated circuit of claim 8, wherein the second laser is a sampled-grating distributed Bragg reflector (SGDBR) laser and the first laser is a distributed feedback (DFB) laser.

10. The photonic integrated circuit of claim 8, wherein the first laser is a distributed feedback (DFB) laser, further comprising a gain region and wherein the first grating is a distributed grating having uniform spacing.

11. The photonic integrated circuit of claim 9, wherein the second laser is a sampled-grating distributed Bragg reflector (SGDBR) laser, wherein the third grating has third grooves formed substantially perpendicular to a direction that light travels in the second waveguide, the third grooves have a depth that is the same is the depth of the first grooves and the second grooves, the third grooves have a third non-etched gap with a third width chosen to achieve a specified third K of the third mirror.

12. The photonic integrated circuit of claim 11, wherein the second laser further comparisons a gain section and a phase section between the second mirror and the third mirror.

13. The photonic integrated circuit of claim 8, wherein the first varying width of the first non-etched gap varies across the grooves.

14. The photonic integrated circuit of claim 8, wherein the first varying width of the first non-etched gap varies across the grooves to implement a chirp.

* * * * *